(12) United States Patent
Oh et al.

(10) Patent No.: US 11,278,878 B2
(45) Date of Patent: Mar. 22, 2022

(54) METHOD FOR PREPARING CATALYST HAVING CONDUCTIVE OXIDE PROTECTIVE LAYER AND CATALYST PREPARED THEREBY

(71) Applicants: Hyundai Motor Company, Seoul (KR); Kia Motors Corporation, Seoul (KR); Institute for Research & Industry Cooperation Pusan National University, Busan (KR)

(72) Inventors: Seung Jeong Oh, Gyeonggi-do (KR); Woong Pyo Hong, Gyeonggi-do (KR); Woo Jae Lee, Busan (KR); Se Hun Kwon, Busan (KR)

(73) Assignees: Hyundai Motor Company, Seoul (KR); Kia Motors Corporation, Seoul (KR); Institute for Research & Industry Cooperation Pusan National University, Busan (KR)

( * ) Notice: Subject to any disclaimer, the term of this patent is extended or adjusted under 35 U.S.C. 154(b) by 95 days.

(21) Appl. No.: 16/800,498

(22) Filed: Feb. 25, 2020

(65) Prior Publication Data
US 2020/0298221 A1 Sep. 24, 2020

(30) Foreign Application Priority Data
Mar. 21, 2019 (KR) .......................... 10-2019-0032313

(51) Int. Cl.
*B01J 37/02* (2006.01)
*B01J 23/42* (2006.01)
(Continued)

(52) U.S. Cl.
CPC .......... *B01J 37/0215* (2013.01); *B01J 23/42* (2013.01); *C23C 16/45525* (2013.01); *B01J 21/18* (2013.01)

(58) Field of Classification Search
CPC ........ B01J 21/18; B01J 23/42; B01J 37/0215; B01J 37/349; C23C 16/405; C23C 16/407;
(Continued)

(56) References Cited

FOREIGN PATENT DOCUMENTS

KR 10-2011-0135305 A 12/2011
KR 101796502 B1 11/2017

OTHER PUBLICATIONS

Zhan, G-D. et al. (2008). Journal of the American Ceramic Society, 91(3), 831-835.*

* cited by examiner

*Primary Examiner* — Brian A McCaig
(74) *Attorney, Agent, or Firm* — Mintz Levin Cohn and Popeo, P.C.; Peter F. Coriess

(57) ABSTRACT

Disclosed is a method of preparing a catalyst having a conductive oxide protective layer. The method may include providing (e.g., supplying) a carbon support having a metal catalyst supported thereon to a fluidized bed reactor, and forming a conductive oxide protective layer using atomic layer deposition (ALD). Particularly, the atomic layer deposition may include supplying a conductive oxide precursor to the fluidized bed reactor, conducting a first purging by supplying an inert gas to the fluidized bed reactor, converting the conductive oxide precursor to conductive oxide by supplying a reactive gas to the fluidized bed reactor, and conducting a second purging by supplying an inert gas to the fluidized bed reactor.

19 Claims, 11 Drawing Sheets

(51) Int. Cl.
*C23C 16/455* (2006.01)
*B01J 21/18* (2006.01)
(58) Field of Classification Search
CPC ....... C23C 16/45525; C23C 16/45555; H01M 4/8657; H01M 4/8663; H01M 4/8892; H01M 4/926; H01M 8/1004; H01M 2008/1095; Y02E 60/50
See application file for complete search history.

METHOD FOR PREPARING CATALYST HAVING CONDUCTIVE OXIDE PROTECTIVE LAYER AND CATALYST PREPARED THEREBY

CROSS-REFERENCE TO RELATED APPLICATION

This application claims, under 35 U.S.C. § 119(a), the benefit of priority to Korean Patent Application No. 10-2019-0032313 filed on Mar. 21, 2019, the entire contents of which are incorporated herein by reference.

TECHNICAL FIELD

The present invention relates to a method for preparing a catalyst having a conductive oxide protective layer and a catalyst prepared thereby.

BACKGROUND

Polymer electrolyte membrane fuel cells (PEMFCs) are high-current density high-power fuel cells, which may provide a high power of at least several tens of kW or more under a variety of operating conditions for application to vehicles. For example, PEMFCs need to stably operate within a wide current density range, to be free from water leakage problems and to be rapidly driven.

The reaction for electricity production by fuel cells occurs in a membrane-electrode assembly (MEA), which includes an ionomer-based membrane and a pair of electrodes, i.e. an anode and a cathode. Meanwhile, a catalyst is generally incorporated in the electrodes in order to enhance the performance of the electrodes for PEMFCs.

For example, a catalyst, in which platinum (Pt) nanoparticles are dispersed in a support made of a carbon (C) material, may be mainly used as a catalyst for fuel cells for the electrochemical reaction. In particular, there is a need for development of approaches capable of improving the efficiency of use of catalysts while reducing the amount of precious metal catalysts such as platinum (Pt). For this purpose, studies are underway to improve the activity of catalysts by adjusting the size of platinum (Pt) particles to a small level of several nanometers (nm). On the other hand, during long-term operation of conventional fuel cells, a coarsening phenomenon (for example, Ostwald ripening), in which metal catalysts contained in a carbon support agglomerate together, occurs.

In the related art, for example, FIGS. 1A and 1B show changes in catalyst distribution in a fuel cell during an initial operation and after long-term operation of a conventional fuel cell, respectively.

As shown in FIG. 1A, the catalysts present in the fuel cell are uniformly distributed in an initial stage in a relatively homogeneous size (mainly 3 to 5 nm). However, as shown in FIG. 1B, when the fuel cell is operated for a long time, a phenomenon (that is, coarsening) in which nano-sized catalyst particles agglomerate together may be observed. Particularly, the catalyst particles agglomerate into particles 6 nm or greater in size, and that a large amount of catalyst particles agglomerate into particles 10 nm or greater in size.

Such agglomeration of catalyst particles may deteriorate the cell performance and the overall durability of the fuel cell. Therefore, there is a need for development of techniques for preventing agglomeration of catalyst particles of fuel cells.

The above information disclosed in this Background section is provided only for enhancement of understanding of the background of the invention and therefore it may contain information that does not form the prior art that is already known in this country to a person of ordinary skill in the art.

SUMMARY

In preferred aspects, provided are catalyst particles that may be agglomerated and contained in a fuel cell so as to enhance the durability of the catalyst by forming a catalyst provided with a conductive oxide protective layer using atomic layer deposition (ALD).

In an aspect, provided is a conductive oxide protective layer uniformly formed on a catalyst having a large surface area and a support by performing atomic layer deposition (ALD).

In an aspect, provide are catalyst particles that may be prevented from agglomeration by forming conductive oxide controlled over an atomic basis as a network structure using atomic layer deposition (ALD).

The objects of the present invention are not limited to those described above. Other details of the present invention are incorporated in the Detailed Description of the Invention and drawings.

In one preferred aspect, provided is a method of preparing a catalyst including a conductive oxide protective layer. The method may include providing, e.g., supplying, a carbon support including a metal catalyst supported thereon to (into) a fluidized bed reactor, and forming a conductive oxide protective layer using atomic layer deposition (ALD). The conductive oxide protective layer suitably may be formed on or around the carbon support and the metal catalyst as provided in the fluidized bed reactor.

The term "atomic layer deposition" or "ALD" as used herein refers to deposition technique forming a surficial structure (e.g., thin-film or a net-like surface), for example, having a thickness at atomic level. For example, the ALD may include sequential use of a gas phase chemical process, for example, by using two chemicals or precursors. In certain embodiments, these precursors may react on a surface of a substrate (e.g., carbon support), one at a time in a sequential manner. In certain embodiments, separate and/or different precursors may be sequentially and/or alternately exposed to the surface for the reaction so as to form a net-like surface.

The atomic layer deposition may suitably include supplying a conductive oxide precursor to the fluidized bed reactor, conducting a first purging by supplying an inert gas to the fluidized bed reactor, converting the conductive oxide precursor to conductive oxide by supplying a reactive gas to the fluidized bed reactor, and conducting a second purging by supplying an inert gas to (into) the fluidized bed reactor.

Preferably, the metal catalyst may include platinum (Pt).

The method may further include adjusting an internal pressure, by pumping, of the fluidized bed reactor to about 0.1 Torr to 0.5 Torr, after the providing the carbon support to the fluidized bed reactor and before the forming the conductive oxide protective layer.

In the step of supplying the conductive oxide precursor to the fluidized bed reactor, the conductive oxide precursor may include titanium (IV) isopropoxide ($Ti[OCH(CH_3)_2]_4$, tin (IV) chloride ($SnCl_4$) and a combination thereof.

In the step of supplying the conductive oxide precursor to the fluidized bed reactor, a deposition operation pressure of the conductive oxide precursor may suitably be about 1 Torr to 5 Torr.

In the step of supplying the conductive oxide precursor to the fluidized bed reactor, the conductive oxide precursor may be suitably supplied to the fluidized bed reactor for about 20 to 100 seconds.

In the step of converting the conductive oxide precursor to conductive oxide, the reaction gas may include water vapor ($H_2O$).

In the step of converting the conductive oxide precursor to conductive oxide, the reaction gas may be supplied to the fluidized bed reactor at a flow rate from about 10 sccm to about 200 sccm.

In the step of converting the conductive oxide precursor to conductive oxide, the conductive oxide may include titanium dioxide ($TiO_2$), tin dioxide ($SnO_2$) and a combination thereof.

In the step of purging, the inert gas may suitably be purged at a flow rate from about 50 sccm to about 200 sccm.

In the step of purging, the inert gas may be purged for about 60 to 120 seconds.

Preferably, the atomic layer deposition as described herein may be set as one cycle and repeatedly conducted.

The cycle of the atomic layer deposition may suitably be repeatedly conducted about 1 to 20 times.

In another aspect, provided is a catalyst including a conductive oxide protective layer prepared by the method described above. The catalyst may include a carbon support, metal catalyst particles supported on the carbon support, and a conductive oxide protective layer formed on surfaces of the metal catalyst particles and having a network structure.

The term "network structure" as used herein refers to a structure having geometrically connected points (e.g., dots), which do not substantially or entirely cover the structure. Preferably, the connecting parts between the points and the connected points may constitute a net-like structure.

The conductive oxide protective layer may suitably have a thickness of about 0.05 nm to 10 nm.

The metal catalyst particles may suitably include platinum (Pt).

The conductive oxide protective layer may include a conductive oxide including titanium dioxide ($TiO_2$), tin dioxide ($SnO_2$) and a combination thereof.

Also provided is a polymer electrolyte membrane for a fuel cell that may include the catalyst as described herein.

Further provided is a fuel cell including the polymer electrolyte membrane as described herein.

Other aspects and preferred embodiments of the invention are discussed infra.

BRIEF DESCRIPTION OF THE DRAWINGS

The above and other features of the present invention will now be described in detail with reference to certain exemplary embodiments thereof illustrated in the accompanying drawings which are given herein below by way of illustration only, and thus are not limitative of the present invention, and wherein.

DETAILED DESCRIPTION

Figure 1A:
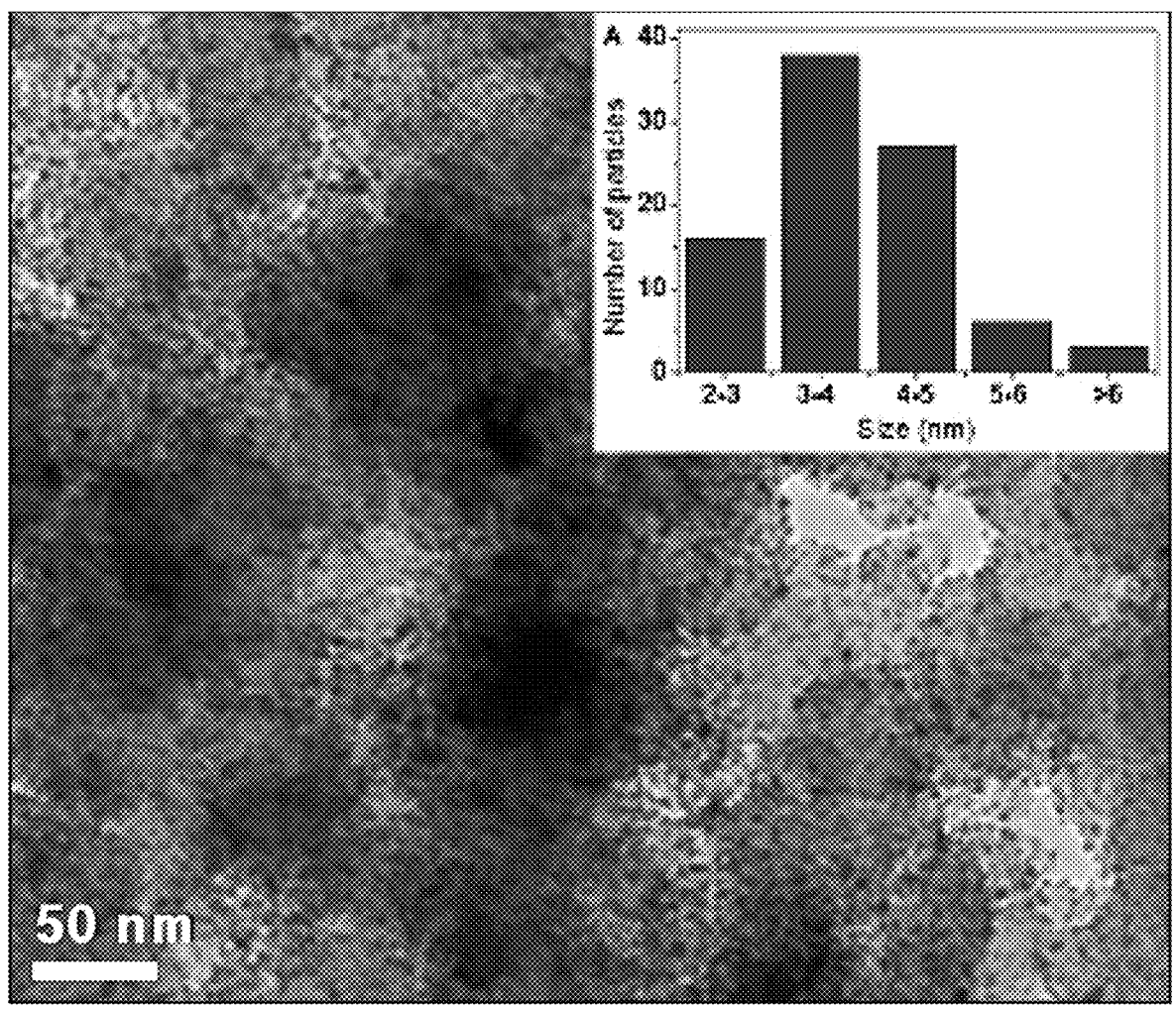
FIGS. 1A and 1B show changes in catalyst distribution in a conventional fuel cell during an initial operation and after long-term operation of a conventional fuel cell, respectively.

Hereinafter, various exemplary embodiments of the present invention will be described in detail with reference to the attached drawings. Advantages and features of the present invention and methods for accomplishing the same will be clearly understood from the following preferred embodiments with reference to the attached drawings. However, the present invention is not limited to the embodiments, and will be embodied in different forms. The embodiments are suggested only to offer thorough and complete understanding of the disclosed contents and to sufficiently inform those skilled in the art of the technical concept of the present invention. The scope of the present invention is defined only by the claims. Like reference numbers refer to like elements throughout the description of the figures.

Unless differently defined, all terms used herein (including technical or scientific terms) have the same meanings as those generally understood by those skilled in the art to which the present invention pertains. In addition, terms identical to those defined in generally used dictionaries should be interpreted as having meanings identical to contextual meanings of the related art, and are not to be interpreted as having ideal or excessively formal meanings unless they are definitely defined in the present specification.

In addition, terms herein used are provided only for illustration of embodiments and should not be construed as limiting the scope of the present invention. Singular forms are intended to include plural forms as well, unless the context clearly indicates otherwise. It will be further understood that the terms "comprises", "includes" and the like, when used in this specification, specify the presence of stated elements, features, numbers, steps and/or operations, but do not preclude the presence or addition of one or more other elements, features, numbers, steps and/or operations. In addition, "and/or" includes each of the mentioned items as well as a combination of one or more thereof.

In addition, it will be understood that when an element such as a layer, film, region or substrate is referred to as being "on" another element, it can be directly on the other element, or an intervening element may also be present. It will also be understood that, when an element such as a layer, film, region or substrate is referred to as being "under" another element, it can be directly under the other element, or an intervening element may also be present.

Unless the context clearly indicates otherwise, all numbers, figures and/or expressions that represent ingredients, reaction conditions, polymer compositions and amounts of mixtures used in the specification are approximations that reflect various uncertainties of measurement occurring inherently in obtaining these figures, among other things. For this reason, it should be understood that, in all cases, the term "about" should be understood to modify all numbers, figures and/or expressions. Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Further, unless otherwise clear from the context, all numerical values provided herein are modified by the term "about."

In addition, when numerical ranges are disclosed in the description, these ranges are continuous and include all numbers from the minimum to the maximum including the maximum within each range unless otherwise defined. Furthermore, when the range refers to an integer, it includes all integers from the minimum to the maximum including the maximum within the range, unless otherwise defined.

Hereinafter, the present invention will be described in more detail with reference to the attached drawings.

Figure 2:
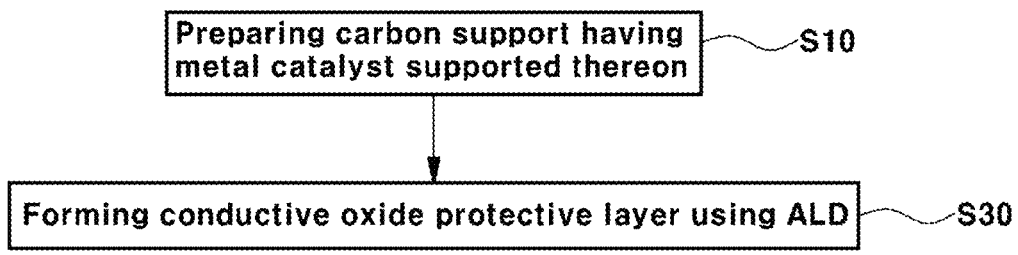
FIG. 2 is a flowchart illustrating an exemplary method of preparing an exemplary catalyst provided with an exemplary conductive oxide protective layer according to exemplary embodiments of the present invention.
Figure 3:
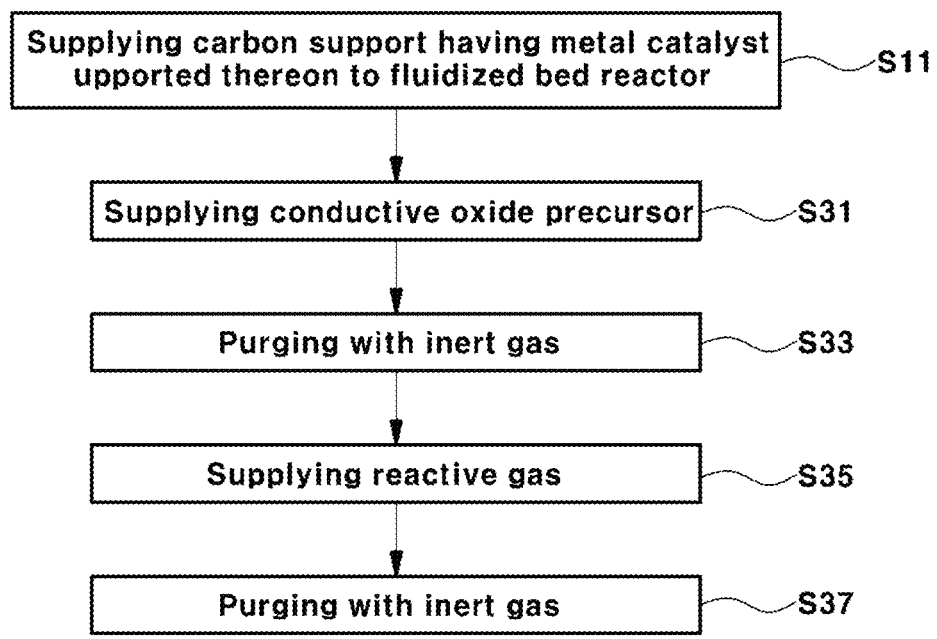
FIG. 3 is a flowchart illustrating an exemplary method of preparing an exemplary catalyst provided with an exemplary conductive oxide protective layer according to an exemplary embodiment of the present invention.

FIGS. 2 and 3 are flowcharts illustrating an exemplary method of preparing an exemplary catalyst provided with an exemplary conductive oxide protective layer according to exemplary embodiments of the present invention.

As shown in FIG. 2, the method of preparing a catalyst provided with a conductive oxide protective layer according to exemplary embodiments of the present invention may include preparing a carbon support having a metal catalyst supported thereon S10 and forming a conductive oxide protective layer using atomic layer deposition (ALD) S30.

Further, the method for preparing a catalyst provided with a conductive oxide protective layer, particularly including steps of an exemplary atomic layer deposition (ALD), will be described with reference to FIG. 3.

As shown in FIG. 3, the method of preparing an exemplary catalyst provided with the conductive oxide protective layer according to an exemplary embodiment of the present invention may include providing, e.g., supplying, a carbon support having a metal catalyst supported thereon to a fluidized bed reactor S11 and forming a conductive oxide protective layer using atomic layer deposition (ALD) S31 to S37.

Particularly, the atomic layer deposition may include supplying a conductive oxide precursor to a fluidized bed reactor S31, conducting first purging by supplying an inert gas to the fluidized bed reactor S33, converting the conductive oxide precursor to conductive oxide by supplying a reactive gas to the fluidized bed reactor S35, and conducting second purging by supplying an inert gas to the fluidized bed reactor S37.

In step S11 of supplying a conductive oxide precursor to a fluidized bed reactor, the metal catalyst may include platinum (Pt), but the present invention is not limited thereto.

In particular, in step S31 of supplying a conductive oxide precursor to a fluidized bed reactor, the conductive oxide precursor may be, for example, selected from the group consisting of titanium (IV) isopropoxide (($Ti[OCH(CH_3)_2]_4$, refer to the following Formula 1), tin (IV) chloride ($SnCl_4$), refer to the following Formula 2), and a combination thereof.

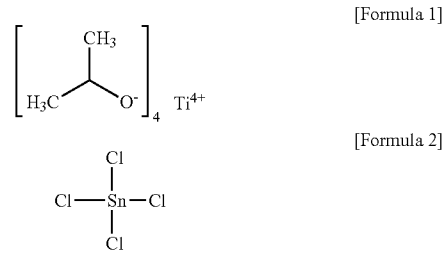

[Formula 1]

[Formula 2]

In addition, the deposition operation pressure of the conductive oxide precursor may be preferably about 1 Torr to 5 Torr. That is, the deposition pressure may be maintained at about 1 Torr to 5 Torr.

In addition, such a conductive oxide precursor may be supplied to the fluidized bed reactor for about 20 to 100 seconds.

The step S33 of first purging may be performed after step S31 of supplying the conductive oxide precursor and before step S35 of supplying the reaction gas. This purging step S33 may include purging inert gas at a flow rate from about 50 sccm to about 200 sccm. In addition, the inert gas is preferably purged for about 60 to 120 seconds. The purging step S33 enables the removal of unreacted residual radicals.

In step S35 of converting the conductive oxide precursor to conductive oxide by supplying the reaction gas to the fluidized bed reactor, the reaction gas may include, for example, water ($H_2O$), particularly, water vapor. Also, such a reaction gas may be supplied to the fluidized bed reactor at a flow rate from about 10 sccm to about 200 sccm.

Through the reaction with the reaction gas, the conductive oxide precursor may be converted to conductive oxide, and this conductive oxide may suitably include, for example, titanium dioxide ($TiO_2$), tin dioxide ($SnO_2$) and a combination thereof.

On the other hand, after supplying a reaction gas S35, second purging S37 may be performed. This purging step S37 may include purging the inert gas at a flow rate from about 50 sccm to about 200 sccm. In addition, the inert gas may preferably be purged for about 60 to 120 seconds. This purging step S37 may enable the removal of unreacted residual radicals.

Meanwhile, in the method of manufacturing a catalyst provided with a conductive oxide protective layer according to exemplary embodiments of the present invention, sequentially performing a series of steps (e.g., S31 to S37) of the atomic layer deposition described above may beset as one cycle and repeatedly conducted.

This cycle may be preferably performed repeatedly about one to twenty times. Meanwhile, as the number of cycles increases, the thickness of the formed conductive oxide protective layer may increase. For example, when the conductive oxide protective layer contains titanium dioxide ($TiO_2$), the effect of improving the catalyst durability may be most excellent when the above-described cycle is performed repeatedly, preferably about 10 times or greater. In addition, in the case where the conductive oxide protective layer contains tin dioxide ($SnO_2$), the effect of improving the catalyst durability may be excellent when the above-described cycle is performed repeatedly, preferably about five times or greater.

As described above, through the preparation method using an atomic layer deposition process using a fluidized bed reactor (ALD-FBR), a conductive oxide protective layer may be formed in a structure (for example, network structure) not covering the entire surface of the metal oxide supported on the carbon support. Further, the conductive oxide protective layer thus formed may prevent catalyst particles (for example, precious metal nanoparticles) from being eluted or agglomerating (coarsening).

Particularly, when using a conventional wet process or another vapor deposition process (such as PVD or CVD), the desired conductive oxide protective layer may be formed as a layer and applied to the entire surface of the catalyst particles, so there is a risk of deterioration of catalyst activity. However, in the preparation method according to exemplary embodiments of the present invention, a conductive oxide protective layer may be evenly formed on catalyst particles, such that the conductive oxide protective layer may have a structure that does not interfere with contact of the catalyst particles with oxygen ($O_2$) or hydrogen ($H_2$). As a result, a catalyst for fuel cells that is capable of preventing coarsening while maintaining or improving catalytic activity may be prepared. As a result, the durability of the fuel cell catalyst may be greatly improved.

Figure 1B:
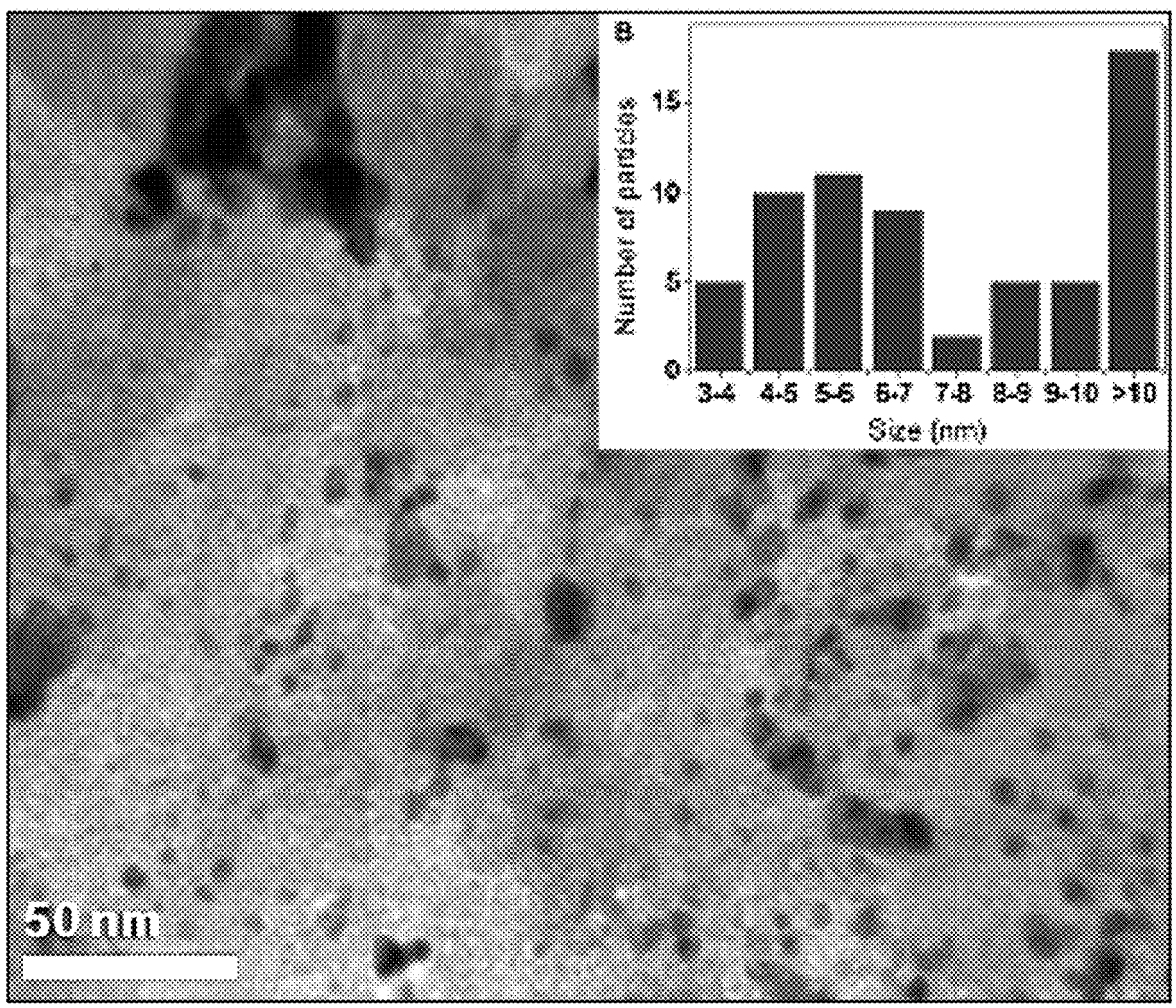

Hereinafter, the method of preparing the catalyst provided with a conductive oxide protective layer will be described in detail with reference to the apparatus shown in FIG. 4. For convenience of explanation, the following description focuses on differences from those described with reference to FIGS. 1 to 3.

Figure 4:
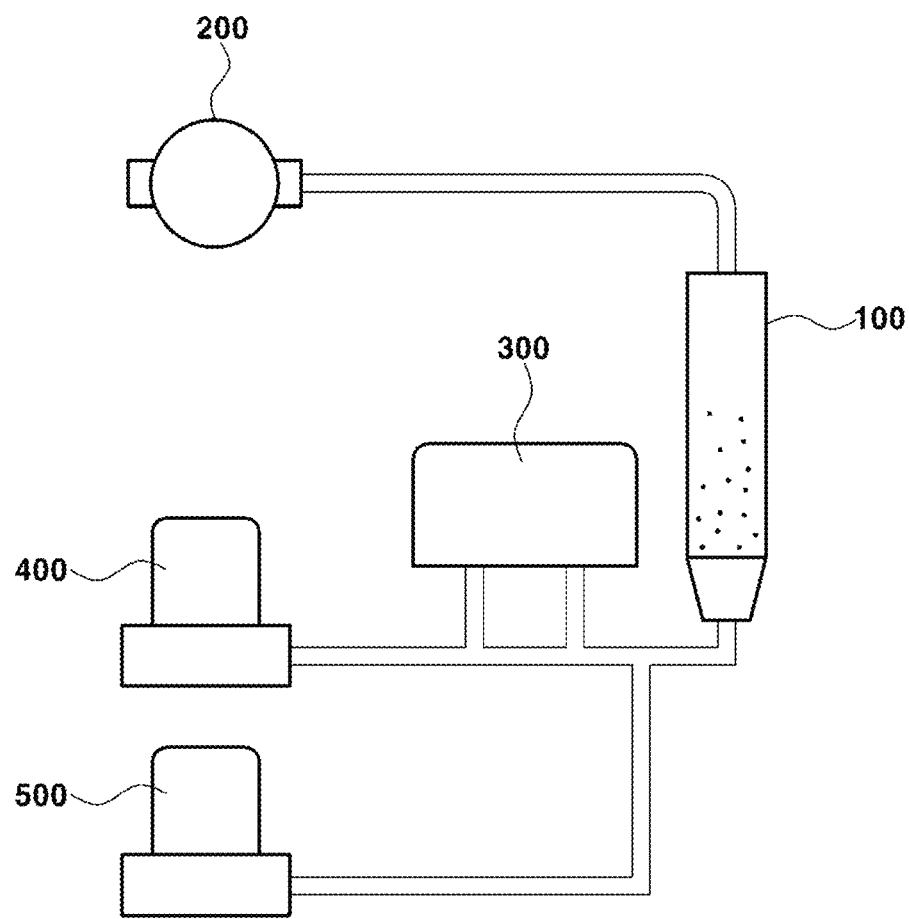
FIG. 4 is a schematic diagram illustrating an exemplary apparatus used for an exemplary method of preparing the catalyst provided with an exemplary conductive oxide protective layer according to exemplary embodiments of the present invention.

FIG. 4 is a schematic diagram illustrating an exemplary apparatus used for the method of preparing an exemplary catalyst provided with an exemplary conductive oxide protective layer according to exemplary embodiments of the present invention.

As shown in FIG. 4, a fluidized bed reactor for atomic layer deposition (ALD-FBR) used for some embodiments of the present invention may include a fluidized bed reactor 100, a rotary pump (or vacuum pump) 200 for controlling the internal pressure of the fluidized bed reactor 100, a container 300 containing a conductive oxide precursor for introducing the conductive oxide precursor into the fluidized bed reactor 100, an inert gas tank 400 for introducing a purge gas into the fluidized bed reactor 100, and a reaction gas tank 500 for introducing a reaction gas into the fluidized bed reactor 100. Meanwhile, each of the gas tanks 400 and 500 may include a mass flow controller (MFC).

The fluidized bed reactor 100 may also serve as a chamber for atomic layer deposition (ALD), and thus may be initially vacuumized with the rotary pump 200, and the strength of the vacuum, for example, the operation pressure, may be maintained constant even during the process. Accordingly, a carbon support, on which a metal catalyst (for example, platinum (Pt)) may be supported, may be introduced into the fluidized bed reactor 100 (see S11 in FIG. 3).

Meanwhile, a conductive oxide precursor (for example, titanium (IV) isopropoxide ($Ti[OCH(CH_3)_2]$) or tin (IV) chloride ($SnCl_4$)), which is used to form a conductive oxide protective layer (for example, titanium dioxide ($TiO_2$) or tin dioxide($SnO_2$)), may be introduced into the container 300 and connected to the fluidized bed reactor 100 through a channel.

An inert gas (for example, argon (Ar)), serving as a purge gas necessary for performing atomic layer deposition (ALD), may be prepared in the inert gas tank 400, and a reactive gas (for example, water vapor ($H_2O$)) may be prepared in the reaction gas tank 500 and may be connected to the fluidized bed reactor 100 through each mass flow controller (MFC).

Meanwhile, purging using the inert gas tank 400 (e.g., S33 and S37 in FIG. 3) may be performed at a flow rate from about 50 sccm to about 200 sccm, as described above. Preferably, argon (Ar), which is an inert gas, may be continuously introduced into the fluidized bed reactor 100 from the inert gas tank 400 at a flow rate of about 80 sccm to about 120 sccm through a mass flow controller (MFC).

Meanwhile, the fluidized bed reactor 100 may initially be pumped at an internal pressure of about 0.1 Torr to 0.5 Torr, preferably 0.4 Torr. For example, platinum-supported carbon support (Pt/C) particles may be fed to the fluidized bed reactor 100 and then pumped at the above-described base pressure. Particularly, for example, the method may further include pumping so as to adjust the internal pressure of the fluidized bed reactor 100 to about 0.1 Torr to 0.5 Torr, after step S11 of supplying the carbon support having a metal catalyst supported thereon to the fluidized bed reactor 100 and before the step of supplying the conductive oxide precursor (see S31 in FIG. 3).

Meanwhile, the internal reaction temperature of the fluidized bed reactor 100 may be maintained at about 300° C., the temperature of each channel may be maintained at about 100° C., and the internal temperature of the container 300 may be maintained from room temperature to about 50° C. For example, the internal temperature of a container having a conductive oxide precursor containing titanium (Ti) may be maintained at about 50° C. and the internal temperature of a container having a conductive oxide precursor containing tin (Sn) may be maintained at room temperature.

In an exemplary embodiment, an inert gas (e.g., argon (Ar)) contained in the inert gas tank 400 during the process may be introduced into the fluidized bed reactor 100 at a flow rate of about 100 sccm through a mass flow controller (MFC). Accordingly, in the crucible of the fluidized bed reactor 100, a metal catalyst-supported carbon support (for example, a platinum-supported carbon support (Pt/C)) can be fluidized and float, and the conductive oxide precursor may be fed thereto S31.

The conductive oxide precursor may contact catalyst particles so as to be attached in a dot form to a catalyst composite, and the catalyst composite may include both a metal catalyst and a carbon support. Argon (Ar) gas, as a purge gas, may be fed into the fluidized bed reactor 100, and water vapor ($H_2O$), as a reaction gas, may be fed thereto to adhere the conductive oxide to carbon black of the catalyst composite in a dot form, and an argon (Ar) gas may be fed thereto again and purged. As described above, purging using argon (Ar) gas may serve to remove unreacted residual radicals.

During atomic layer deposition, the operating pressure may be maintained at about 1 Torr to 5 Torr, and the flow rate of the gas may be about 50 sccm to 200 sccm for argon (Ar) and about 10 sccm to 200 sccm for water vapor ($H_2O$). In addition, the time during which the conductive oxide precursor is supplied into the fluidized bed reactor 100 (S31) may range from about 40 seconds to about 100 seconds, the time during which argon (Ar) is purged (S33) may range from about 60 seconds to about 120 seconds, the time during which water vapor ($H_2O$) is purged (e.g., S35 in FIG. 3) may range from about 40 seconds to about 100 seconds, and the time during which argon (Ar) is purged (S37) may range from about 60 seconds to about 120 seconds. A unit cycle including S31, S33, S35 and S37 as described above may be repeatedly performed several times.

Figure 5A:
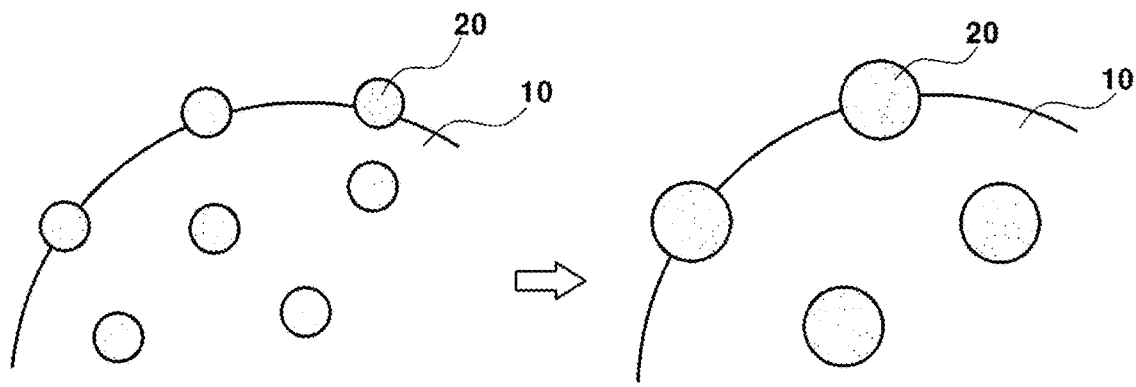
FIGS. 5A and 5B are conceptual diagrams showing changes of a conventional fuel cell and catalyst composites according to exemplary embodiments of the present invention, as the fuel cell operating time increases, respectively.
Figure 5B:
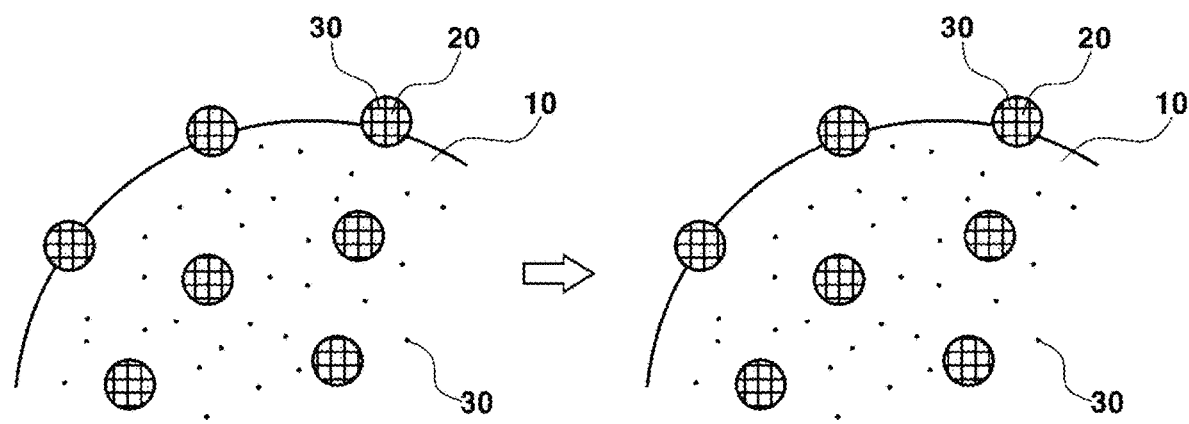

FIGS. 5A and 5B are conceptual diagrams respectively showing changes in a conventional fuel cell and catalyst composites according to exemplary embodiments of the present invention as the fuel cell operation time increases.

As shown in FIG. 5A, in the conventional fuel cell, the catalyst composite may include a carbon support 10 and metal catalyst particles 20 supported on the carbon support 10. In such a conventional catalyst composite, as the operation time increases, adjacent metal catalyst particles 20 may agglomerate (in other words, be coarsened). For example, as Ostwald ripening occurs between the metal catalyst particles 20, the size of the metal catalyst particles 20 may increase. Thus, unlike in the initial stage of operation, the surface area where the metal catalyst particles 20 may contact hydrogen ($H_2$) or oxygen ($O_2$) during the fuel cell reaction can be reduced, so the catalytic activity may be reduced.

On the other hand, the catalyst composite according to exemplary embodiments of the present invention may be prepared by the above-described method (see FIG. 1 or 3), and thus the conductive oxide protective layer 30 may also be formed.

Moreover, as shown FIG. 5B, such a catalyst composite may be formed on the surfaces of the carbon support 10, the metal catalyst particles 20 supported on the carbon support 10, and the metal catalyst particles 20, and may include a conductive oxide protection layer 30 having a network structure. The metal catalyst particles 20 may include, for example, platinum (Pt).

The mechanism of forming the conductive oxide protective layer 30 through atomic layer deposition (ALD) will be described. When the conductive oxide precursor is introduced into the carbon support 10 having the metal catalyst particles 20 supported thereon, the conductive oxide precursor may be adsorbed on metal catalyst particles (particularly, precious metal particles) 20 having a surface energy higher than that of the carbon support 10. Thus, the conductive oxide precursor may be adsorbed more on the surface of the metal catalyst particles 20 than on the surface of the carbon support 10 (see S31 in FIG. 3).

In addition, when contacting the reactive gas, the conductive oxide precursor may be converted to a conductive oxide protective layer 30 including a conductive oxide selected from the group consisting of titanium dioxide ($TiO_2$), tin dioxide ($SnO_2$), and a combination thereof, (e.g., S35 in FIG. 3). Particularly, the conductive oxide such as titanium dioxide ($TiO_2$) or tin dioxide ($SnO_2$) may be deposited through atomic layer deposition (ALD). In an initial stage, the conductive oxide may be deposited in a dot form and gradually may grow and meet adjacent conductive oxide in the form of dots to form a network structure. Then, the network structures gradually may grow to form a layer and thereby realize a conductive oxide protective layer 30.

Since the surface energy of the surface of the metal catalyst particles 20 is greater than that of the surface of the carbon support 10, as shown in FIG. 5B, a conductive oxide network structure may be first formed on the surface of the metal catalyst particles 20, and then conductive oxide may be present in the form of nano-sized dots on the carbon support 10. The conductive oxide protective layer 30 having a network structure thus formed may prevent the nano-sized metal catalyst particles 20 from agglomerating together (coarsening).

According to various exemplary embodiments of the present invention, by using the atomic layer deposition process, the conductive oxide protective layer 30 may be uniformly formed to have a network structure that does not completely cover the metal catalyst particles 20. As such, these catalyst particles may be effectively prevented from agglomeration without interfering with contact between the catalyst particles and oxygen ($O_2$) or hydrogen ($H_2$), thereby maintaining and improving catalytic activity and improving durability despite operation of a fuel cell.

Preferably, the thickness of such a conductive oxide protective layer 30 may be about 0.05 nm to 10 nm. In particular, when the thickness of the conductive oxide protective layer 30 is about 10 nm or less, the effect of improving durability may be maximized while maintaining catalytic activity.

Example

Hereinafter, the present invention will be described in more detail with reference to specific examples and comparative examples. However, the following examples are provided only for illustration of the present invention, and should not be construed as limiting the scope of the present invention.

Example 1

Conductive Oxide Protective Layer Containing Titanium Dioxide ($TiO_2$)

An atomic layer deposition process using a fluidized bed reactor (ALD-FBR) was conducted in the following manner to prepare a catalyst composite in which platinum (Pt) nanoparticles were supported on a carbon support as a metal catalyst. At this time, the operating pressure was maintained at 1 Torr to 5 Torr.

(1) Platinum-supported carbon support (Pt/C) particles were fed to a fluidized bed reactor and pumped such that the base pressure of the fluidized bed reactor was 0.4 Torr. At this time, the internal temperature of the fluidized bed reactor was maintained at a temperature of 300° C., and the temperature of the channel was maintained at about 100° C.

(2) An inert gas tank containing a Ti precursor was maintained at an internal temperature of 50° C., and the Ti precursor was injected from the inert gas tank into the fluidized bed reactor for 40 to 100 seconds.

(3) Argon (Ar) gas was purged from the inert gas tank through a mass flow controller (MFC) at a flow rate of 100 sccm for 60 to 120 seconds. At this time, the platinum-supported carbon support (Pt/C) in the fluidized bed reactor was fluidized and floated.

(4) Water vapor ($H_2O$) was injected into the fluidized bed reactor at a flow rate of 10 sccm and 200 sccm for 40 seconds to 100 seconds. Thus, it was possible to attach the conductive oxide ($TiO_2$) to the platinum-supported carbon support (Pt/C) in a dotted form.

(5) Again, purging was conducted by injecting an argon (Ar) gas into the fluidized bed reactor at a flow rate of 50 sccm to 200 sccm for 60 seconds to 120 seconds to remove unreacted residual radicals.

The series of the processes of (2) to (5) described above were set at a cycle, and the cycle was repeatedly conducted once ($TiO_2$ 1-Pt 1), three times ($TiO_2$3-Pt 15), five times ($TiO_2$ 5-Pt 15) and ten times ($TiO_2$ 10-Pt 15).

Example 2

Conductive Oxide Protective Layer Containing Tin Dioxide ($SnO_2$)

An atomic layer deposition process using a fluidized bed reactor (ALD-FBR) was conducted in the following manner to prepare a catalyst composite in which platinum (Pt) nanoparticles were supported on a carbon support as a metal catalyst. At this time, the operating pressure was maintained at 1 Torr to 5 Torr.

(1) Platinum-supported carbon support (Pt/C) particles were fed to a fluidized bed reactor and pumped such that the base pressure of the fluidized bed reactor was 0.4 Torr. At this time, the internal temperature of the fluidized bed reactor was maintained at a temperature of 300° C., and the temperature of the channel was maintained at a temperature of 100° C.

(2) An inert gas tank containing a Sn precursor can be maintained at an internal temperature of room temperature and the Sn precursor was injected from the inert gas tank into the fluidized bed reactor for 20 to 80 seconds.

(3) Argon (Ar) gas was purged from the inert gas tank through a mass flow controller (MFC) at a flow rate of 100 sccm for 60 to 120 seconds. At this time, the platinum-supported carbon support (Pt/C) in the fluidized bed reactor was fluidized and floated.

(4) Water vapor ($H_2O$) was injected into the fluidized bed reactor at a flow rate of 10 sccm and 200 sccm for 40 seconds to 100 seconds. Thus, it was possible to attach the conductive oxide ($SnO_2$) to the platinum-supported carbon support (Pt/C) in a dotted form.

(5) Again, purging was conducted by injecting an argon (Ar) gas into the fluidized bed reactor at a flow rate of 50 sccm to 200 sccm for 60 seconds to 120 seconds to remove unreacted residual radicals.

The series of the processes of (2) to (5) described above was set at a cycle and the cycle was repeatedly conducted once ($SnO_2$ 1-Pt 1), three times ($SnO_2$ 3-Pt 15), five times ($SnO_2$ 5-Pt 15) and ten times ($SnO_2$ 10-Pt 15).

Evaluation Example 1

Deposition Rate Per Cycle [Å/Cycle]

The deposition rate per cycle of the titanium dioxide ($TiO_2$), which was used as a conductive oxide in Example 1, was observed at 0.49 Å/cycle. The deposition rate of tin dioxide ($SnO_2$), which was used as a conductive oxide in Example 2, was observed at 1.2 Å/cycle.

Evaluation Example 2

Figure 6:
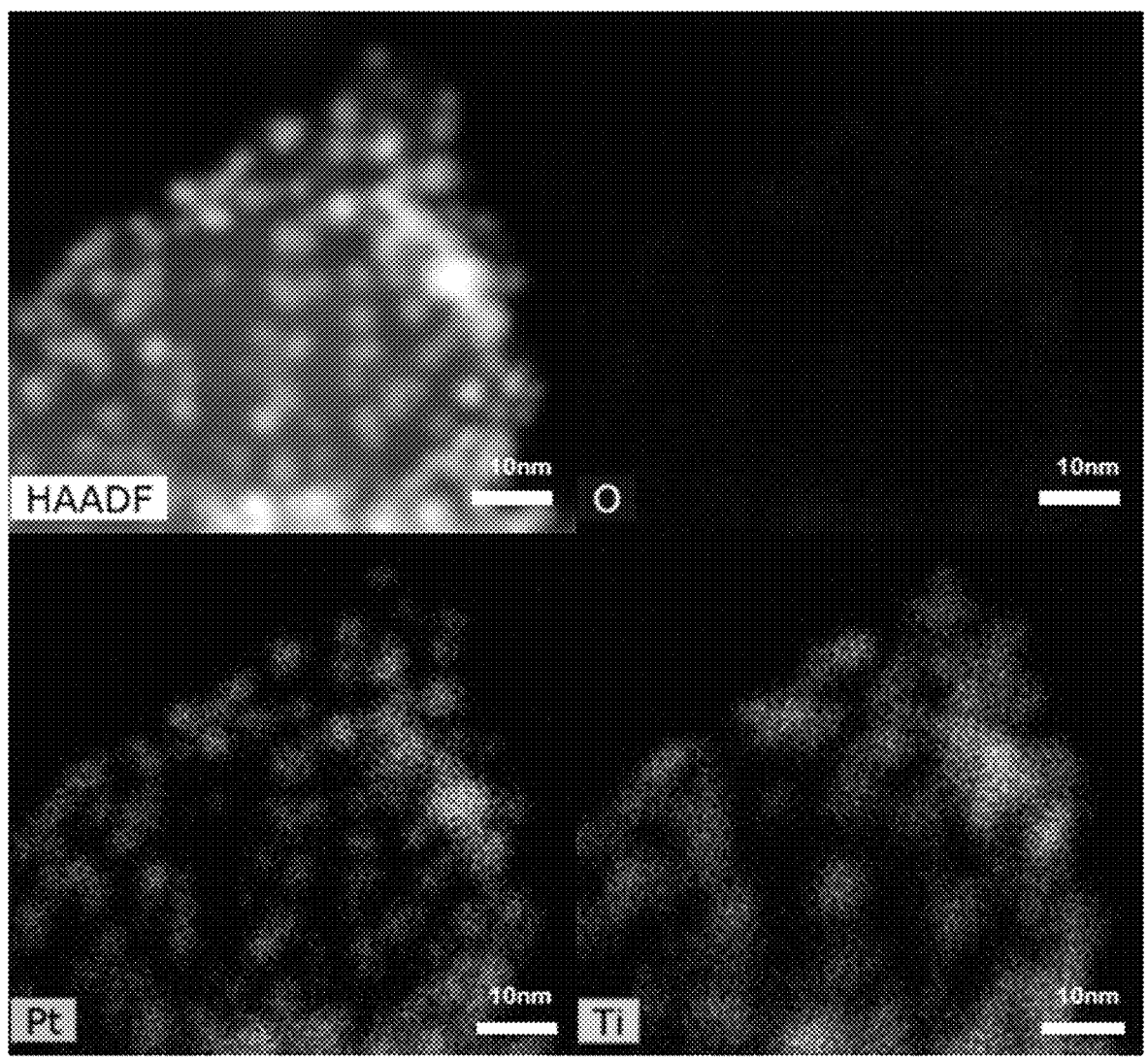
FIG. 6 is a transmission electron microscopy (TEM) and an energy-dispersive X-ray spectroscopy (EDS) image of Example 1.
Figure 7:
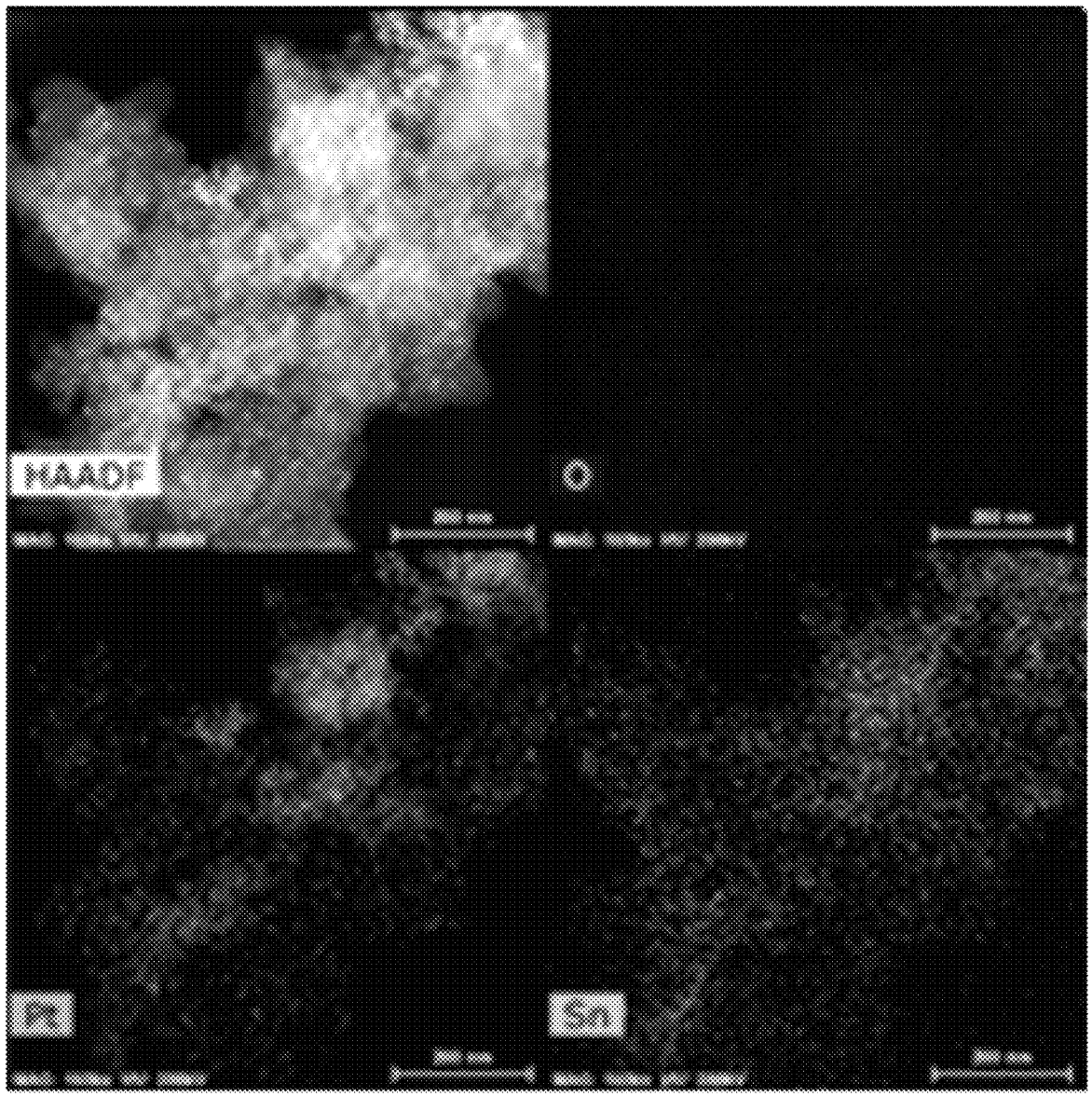
FIG. 7 shows TEM and EDS images of Example 2.

Analysis of Transmission Electron Microscopy (TEM) Image and Energy-Dispersive X-Ray Spectroscopy (EDS) Image of Catalyst Provided with Conductive Oxide Protective Layer FIG. 6 shows TEM and EDS images of Example 1. FIG. 7 shows TEM and EDS images of Example 2.

As shown in FIGS. 6 and 7, titanium dioxide ($TiO_2$) and tin dioxide ($SnO_2$) as respective conductive oxides are particularly uniformly deposited on platinum (Pt) catalyst particles due to the high surface energy of the platinum (Pt).

Evaluation Example 3

Analysis of TEM and Energy-Dispersive X-Ray Spectroscopy (EDS) Images Depending on Number of Cycles Hereinafter, TEM and EDS images depending on a change in the number of cycles in Examples 1 and 2 will be described with reference to FIGS. 8 and 9.

Figure 8:
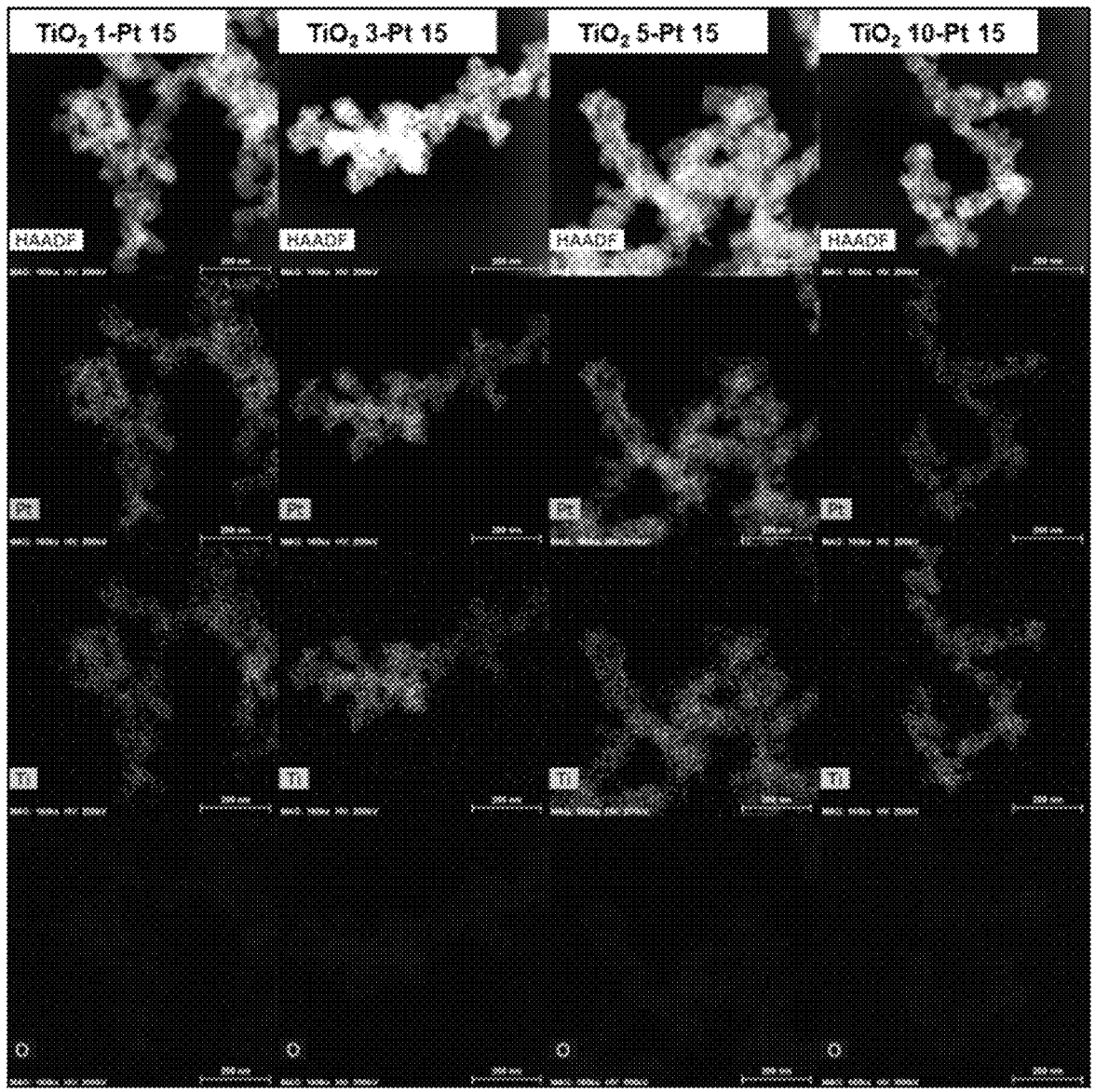
FIG. 8 shows TEM and EDS images depending on a change in the number of cycles in Example 1.

As shown in FIG. 8, it can be seen that the loading ratio of titanium dioxide ($TiO_2$) increases as the number of cycles of atomic layer deposition (ALD) increases in Example 1. Also, it can be seen that as the number of cycles of atomic layer deposition (ALD) increases, the thickness of the titanium dioxide ($TiO_2$) protective layer increases.

Figure 9:
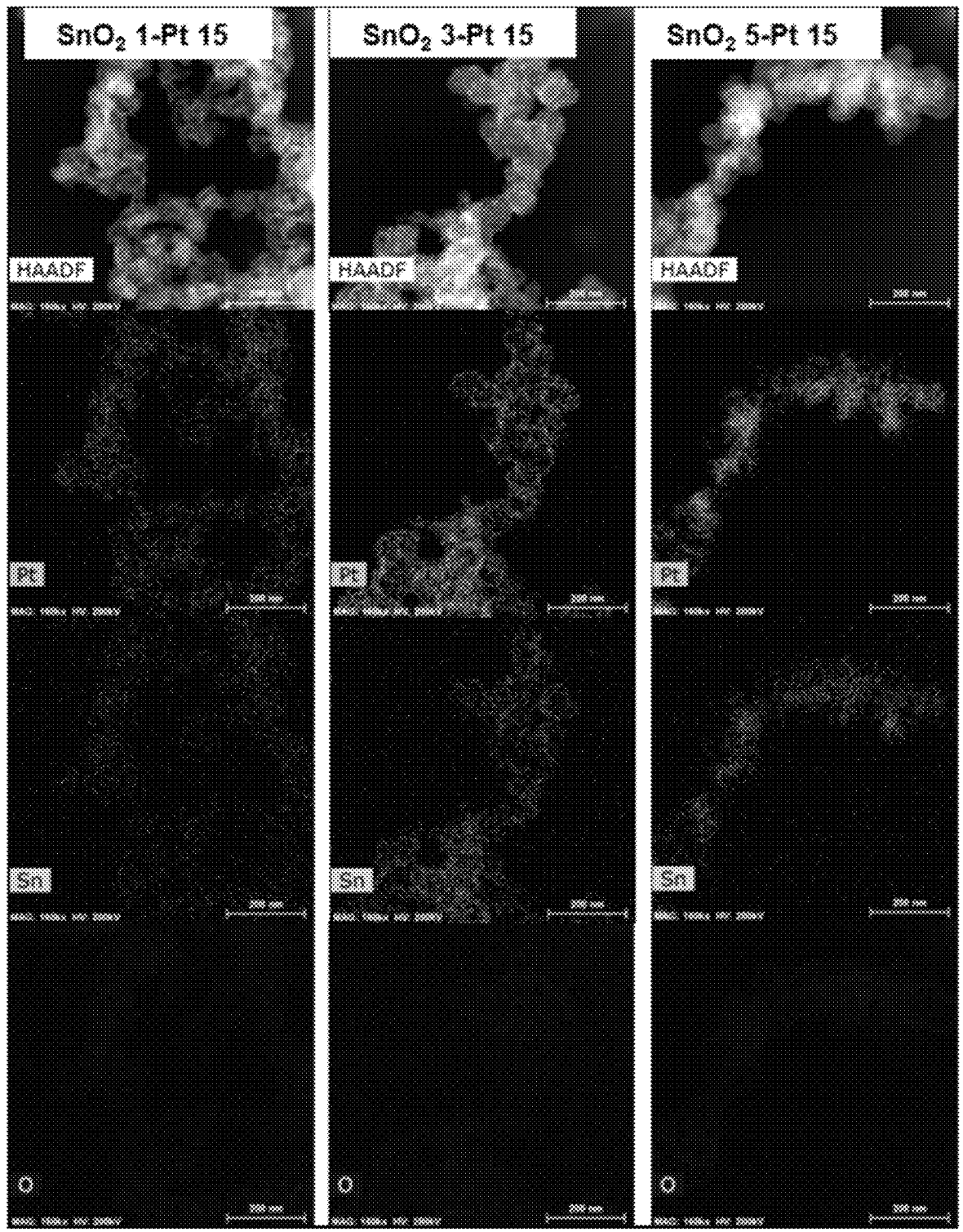
FIG. 9 shows TEM and EDS images depending on a change in the number of cycles in Example 2.

As shown in FIG. 9, as in Example 1, an increase in the loading ratio of tin dioxide ($SnO_2$) and an increase in the thickness of the tin dioxide ($SnO_2$) protective layer can be seen as the number of cycles increases.

Evaluation Example 4

Evaluation of Catalyst Durability Depending on Number of Cycles

Figure 10:
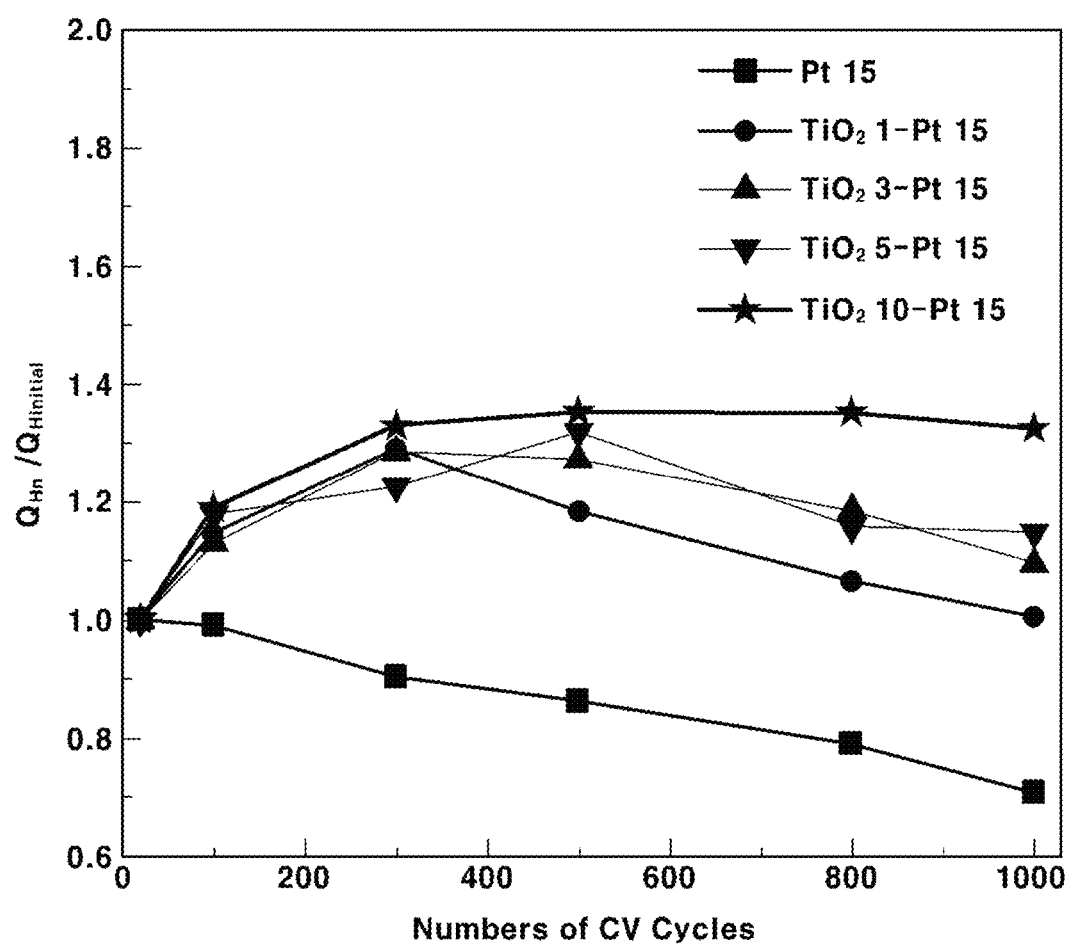
FIG. 10 shows evaluation results of catalyst durability depending on a change in the number of cycles in Example 1.
Figure 11:
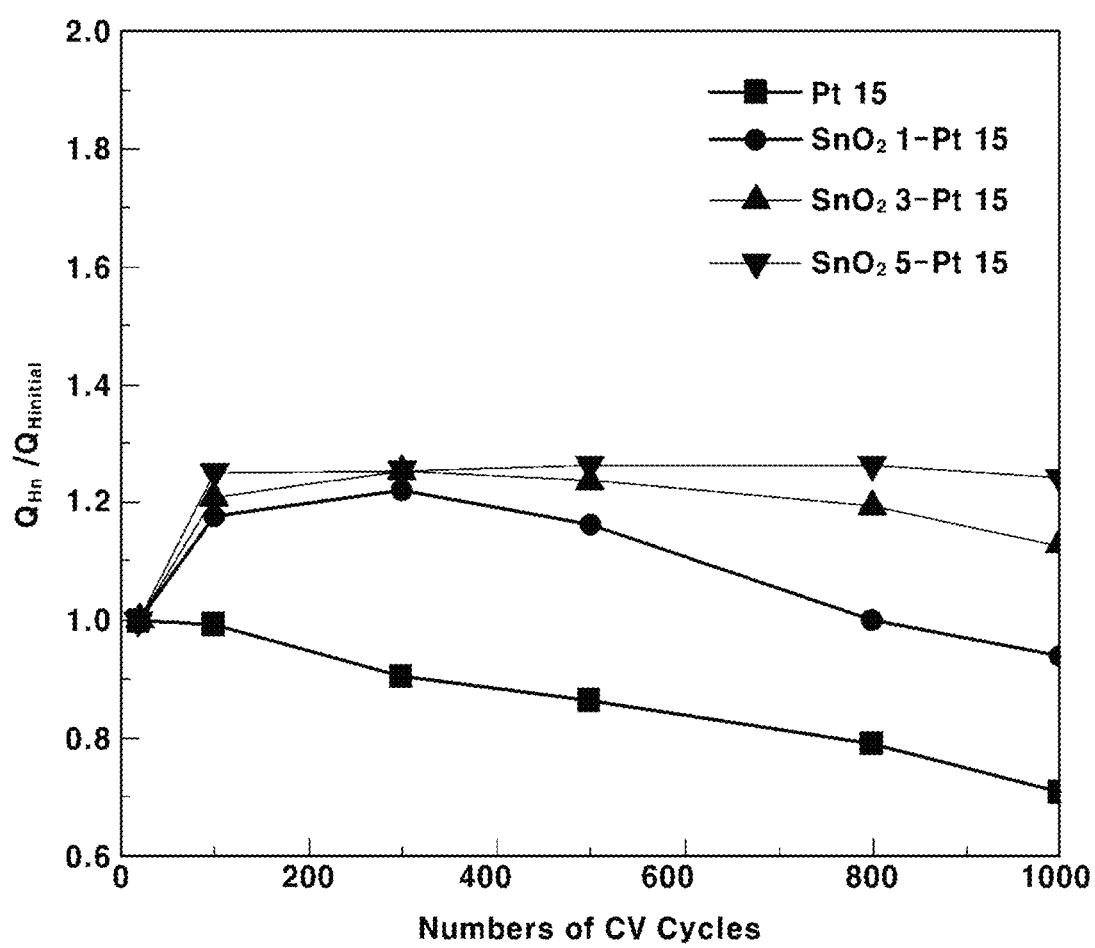
FIG. 11 shows evaluation results of catalyst durability depending on a change in the number of cycles in Example 2.

FIGS. 10 and 11 show the evaluation results of catalyst durability depending on a change in the number of cycles in Examples 1 and 2, respectively.

As shown in FIG. 10, the deposition rate of titanium dioxide ($TiO_2$) that is most suitable for improving the durability of a fuel cell catalyst (i.e., catalyst composite) can be determined through the measurement of a $Q_H$ change depending on the number of CV cycles, as the number of cycles of atomic layer deposition (ALD) of titanium dioxide ($TiO_2$) increases. It can be seen that, as the number of cycles of atomic layer deposition (ALD) increases, the thickness of the $TiO_2$ protective layer increases. In particular, durability is found to be the best at 10 times (see $TiO_2$ 10-Pt 15).

On the other hand, in the case of the catalyst (Pt 15) not having the titanium dioxide ($TiO_2$) protective layer, it can be seen that, as the number of CV cycles increases, the $Q_H$ continuously decreases and durability is thus deteriorated. This demonstrates that when the number of cycles is less than 10, the titanium dioxide ($TiO_2$) protective layer is formed in a dot form, the network structure is insufficient, and agglomeration of catalyst particles occurring during the operation of a fuel cell cannot be effectively prevented. However, when the number of cycles is about 10, it can be seen that the network structure is firmly formed as a net structure of titanium dioxide ($TiO_2$) on the platinum (Pt) catalyst particles, and the durability of the catalyst and the fuel cell are improved.

Further, as shown in FIG. 11, the deposition rate of tin dioxide ($SnO_2$) that is most suitable for improving the durability of a fuel cell catalyst (i.e. the catalyst composite) can be determined through the measurement of a $Q_H$ change depending on the number of CV cycles, as the number of cycles of atomic layer deposition (ALD) of tin dioxide ($SnO_2$) increases in Example 2. It can be seen that, as the number of cycles of atomic layer deposition (ALD) increases, the thickness of the $SnO_2$ protective layer increases. In particular, durability is found to be the best at 5 times (see $SnO_2$ 5-Pt 15).

When the catalyst does not having the tin dioxide ($SnO_2$) protective layer, it can be seen that, as the number of CV cycles increases, $Q_H$ continuously decreases and durability is thus deteriorated. This demonstrates that when the number of cycles is less than 5, the tin dioxide ($SnO_2$) protective layer is formed in a dot form, the network structure is insufficient, and agglomeration of catalyst particles occurring during operation of a fuel cell cannot be effectively prevented. However, when the number of cycles is about 5, it can be seen that the network structure is firmly formed as a net structure of tin dioxide ($SnO_2$) on the platinum (Pt) catalyst particles, and the durability of the catalyst and the fuel cell are improved.

In conclusion, in accordance with the preparation method according to various exemplary embodiments of the present invention utilizing atomic layer deposition using a fluidized bed reactor (ALD-FBR) and nanoparticle catalysts prepared therefrom, the conductive oxide protective layer may be formed as a protective film having a network structure, so that agglomeration of the nano-sized catalyst particles may be prevented without reducing the catalytically active surface area, and thus the performance of fuel cells may be maintained and the durability of the fuel cells is improved. The reason for this is that, as described above, unlike the protective layer formed as a layer for applying the entire surface of catalyst particles when performing a wet process or other vapor deposition process (such as PVD or CVD), the protective layer having a network structure (i.e., conductive oxide protective layer) may be formed through atomic-level deposition, so catalytic activity may be maintained and improved, while preventing coarsening of the catalyst particles.

In accordance with the method of preparing the catalyst provided with a conductive oxide protective layer according to various exemplary embodiments of the present invention, a conductive oxide protective layer may be uniformly formed on a catalyst having a large surface area and a support using atomic layer deposition (ALD).

For example, by controlling conductive oxide on an atomic basis, a conductive oxide protective layer may be formed in a network structure not covering the entire surface of catalyst particles. As a result, coarsening of the catalyst particles may be effectively prevented, without interfering with contact of the catalyst particles with oxygen ($O_2$) or hydrogen ($H_2$).

Also, since coarsening of catalyst particles can be suppressed, catalytic activity may be maintained or improved, and thus the durability of the fuel cell can be greatly improved.

Other effects of the invention are not limited to those described above. The present invention should be understood to include all effects that can be inferred from the aforementioned description.

The invention has been described in detail with reference to exemplary embodiments thereof. However, it will be appreciated by those skilled in the art that changes may be made in these embodiments without departing from the principles and spirit of the invention, the scope of which is defined in the appended claims and their equivalents.

What is claimed is:

1. A method of preparing a catalyst comprising a conductive oxide protective layer comprising:
   providing a carbon support comprising a metal catalyst supported thereon to a fluidized bed reactor; and
   forming a conductive oxide protective layer using atomic layer deposition (ALD),
   wherein the atomic layer deposition comprises:
   supplying a conductive oxide precursor to the fluidized bed reactor;
   conducting a first purging by supplying an inert gas to the fluidized bed reactor;
   converting the conductive oxide precursor to conductive oxide by supplying a reactive gas to the fluidized bed reactor; and
   conducting a second purging by supplying an inert gas to the fluidized bed reactor.

2. The method according to claim 1, wherein the metal catalyst comprises platinum (Pt).

3. The method according to claim 1, further comprising adjusting an internal pressure of the fluidized bed reactor to about 0.1 Torr to 0.5 Torr, after the providing the carbon support to the fluidized bed reactor and before the forming the conductive oxide protective layer.

4. The method according to claim 1, wherein, in the supplying a conductive oxide precursor to the fluidized bed reactor, the conductive oxide precursor comprises titanium (IV) isopropoxide ($Ti[OCH(CH_3)_2]_4$, tin (IV) chloride ($SnCl_4$) and a combination thereof.

5. The method according to claim 1, wherein, in the supplying the conductive oxide precursor to the fluidized bed reactor, a deposition operation pressure of the conductive oxide precursor is about 1 Torr to 5 Torr.

6. The method according to claim 1, wherein, in the supplying the conductive oxide precursor to the fluidized bed reactor, the conductive oxide precursor is supplied to the fluidized bed reactor for about 20 to 100 seconds.

7. The method according to claim 1, wherein, in the converting the conductive oxide precursor to conductive oxide, the reaction gas comprises water vapor ($H_2O$).

8. The method according to claim 1, wherein, in the converting the conductive oxide precursor to conductive oxide, the reaction gas is supplied to the fluidized bed reactor at a flow rate from about 10 sccm to about 200 sccm.

9. The method according to claim 1, wherein, in the converting the conductive oxide precursor to conductive oxide, the conductive oxide comprises titanium dioxide ($TiO_2$), tin dioxide ($SnO_2$) and a combination thereof.

10. The method according to claim 1, wherein, in the first purging and the second purging, the inert gas is purged at a flow rate from about 50 sccm to about 200 sccm.

11. The method according to claim 1, wherein, in the first purging and the second purging, the inert gas is purged for about 60 to 120 seconds.

12. The method according to claim 1, wherein the atomic layer deposition is repeatedly conducted.

13. The method according to claim 12, wherein the atomic layer deposition is repeatedly conducted about 1 to 20 times.

14. A catalyst comprising a conductive oxide protective layer prepared by the method according to claim 1, comprising:
   a carbon support;
   metal catalyst particles supported on the carbon support; and
   a conductive oxide protective layer formed on surfaces of the metal catalyst particles.

15. The catalyst according to claim 14, wherein the conductive oxide protective layer has a thickness of about 0.05 nm to 10 nm.

16. The catalyst according to claim 14, wherein the metal catalyst particles comprise platinum (Pt).

17. The catalyst according to claim 14, wherein the conductive oxide protective layer comprises a conductive oxide comprising titanium dioxide ($TiO_2$), tin dioxide ($SnO_2$) or a combination thereof.

18. A polymer electrolyte membrane for a fuel cell comprising a catalyst of claim 14.

19. A fuel cell comprising a polymer electrolyte membrane of claim 18.

\* \* \* \* \*